(12) United States Patent
Li et al.

(10) Patent No.: US 12,225,825 B2
(45) Date of Patent: Feb. 11, 2025

(54) SYSTEMS AND METHODS FOR ADAPTIVE FLEXURAL WAVE ABSORBER

(71) Applicant: Toyota Motor Engineering & Manufacturing North America, Inc., Plano, TX (US)

(72) Inventors: Xiaopeng Li, Ann Arbor, MI (US); Taehwa Lee, Ann Arbor, MI (US); Hideo Iizuka, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 1008 days.

(21) Appl. No.: 17/193,784

(22) Filed: Mar. 5, 2021

(65) Prior Publication Data

US 2022/0285604 A1 Sep. 8, 2022

(51) Int. Cl.
*H01L 41/113* (2006.01)
*G10K 11/162* (2006.01)
*G10K 11/172* (2006.01)
*H10N 30/30* (2023.01)
*H10N 30/80* (2023.01)

(52) U.S. Cl.
CPC ......... *H10N 30/304* (2023.02); *G10K 11/162* (2013.01); *G10K 11/172* (2013.01); *H10N 30/802* (2023.02)

(58) Field of Classification Search
CPC .... H10N 30/30; H10N 30/302; H10N 30/304; H10N 30/306; H10N 30/308; H10N 30/802

USPC .......................................... 310/339
See application file for complete search history.

(56) References Cited

U.S. PATENT DOCUMENTS

| | | | |
|---|---|---|---|
| 5,558,477 A | 9/1996 | Browning et al. | |
| 6,075,309 A | 6/2000 | Wu | |
| 7,839,058 B1 * | 11/2010 | Churchill | H10N 30/304 310/332 |
| 2003/0209953 A1 * | 11/2003 | Park | F16F 15/005 310/317 |
| 2005/0200243 A1 | 9/2005 | Spangler et al. | |
| 2009/0284102 A1 | 11/2009 | Karakaya et al. | |
| 2011/0260581 A1 * | 10/2011 | Ghoshal | H10N 39/00 310/323.21 |

OTHER PUBLICATIONS

Fleming et al., "Adaptive Piezoelectric Shunt Damping," Smart Materials and Structures, 12, pp. 36-48 (2003).

(Continued)

*Primary Examiner* — Derek J Rosenau
(74) *Attorney, Agent, or Firm* — Christopher G. Darrow; DARROW MUSTAFA PC

(57) ABSTRACT

A flexural wave absorption system includes a base member connected to a beam that may be subject to flexural waves, an arm member, connected to the base, disposed substantially in parallel alignment with the beam, a mass member connected to a distal end of the arm member, a piezoelectric patch, connected to the arm member, that generates electricity in response to a flexural wave propagating through the beam, and a shunting circuit, connected to the piezoelectric patch, that dissipates electricity generated by the piezoelectric patch to absorb the flexural wave.

20 Claims, 11 Drawing Sheets

(56) References Cited

OTHER PUBLICATIONS

Moheimani, "A Survey of Recent Innovations in Vibration Damping and Control Using Shunted Piezoelectric Transducers," IEEE Transactions on Control Systems Technology, vol. 11, No. 4, 13 pages (2003).

Trindade et al., "Multimodal Passive Vibration Control of Sandwich Beams with Shunted Shear Piezoelectric Materials," Smart Materials and Structures, 17, 055015, 10 pages (2008).

Fleming et al., "Optimization and Implementation of Multimode Piezoelectric Shunt Damping Systems," IEEE/ASME Transactions of Mechatronics, vol. 7, No. 1, 8 pages (2002).

Leng, "Controlling flexural waves using subwavelength perfect absorbers: application to Acoustic Black Holes," Le Mans Université, France, Doctoral Thesis by Julien Leng (2019).

Viana et al., "Multimodal Vibration Damping through Piezoelectric Patches and Optimal Resonant Shunt Circuits," J. of the Braz. Soc. of Mech. Sci. & Eng., vol. XXVIII, No. 3, pp. 293-310 (2006).

\* cited by examiner

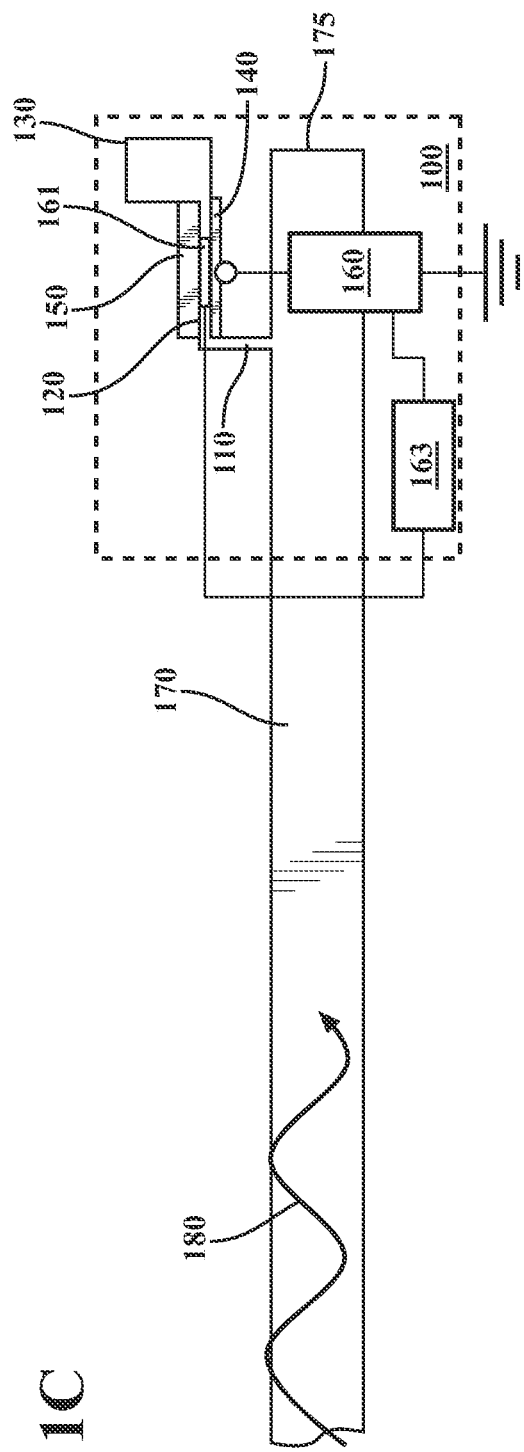

167

$$L = \frac{R_1 R_3 R_4 C}{R_2}$$

SYSTEMS AND METHODS FOR ADAPTIVE FLEXURAL WAVE ABSORBER

TECHNICAL FIELD

The subject matter described herein relates, generally, to systems and methods for absorbing a flexural wave at low frequency, and more particularly, to systems and methods that use an adaptive shunting circuit to absorb flexural waves in a determined low frequency range.

BACKGROUND

Some forms of sound radiation are caused by bending or flexural waves, which deform a structure transversely as the flexural waves propagate. Flexural waves are more complicated than compressional or shear waves and depend on material properties as well as geometric properties. Flexural waves are also dispersive since different frequencies travel at different speeds.

Conventional solutions for absorbing flexural waves include the use of passive dampening materials. For example, soft material such as rubbers, polymeric foams, or elastomers may be utilized to reduce the impact the flexural wave has on a structure. However, totally absorbing the flexural wave is a challenging task using passive materials alone and such solutions tend to employ a one-size-fits-all approach. Some of the major disadvantages of passive absorbers are a lack of tunability without the change of physical geometries and an inability to adapt to the change of flexural waves acting on the mechanical structure. The absorption ability of such conventional solutions is largely reduced as flexural wave frequency decreases. Furthermore, conventional solutions of this type can add a considerable amount of weight to a target system.

SUMMARY

The disclosed apparatuses, methods and systems relate to a tunable flexural wave absorption system. In one embodiment, a flexural wave absorption system, includes a base member connected to a beam that may be subject to flexural waves, an arm member, connected to the base, disposed substantially in parallel alignment with the beam, a mass member connected to a distal end of the arm member, a piezoelectric patch, connected to the arm member, that generates electricity in response to a flexural wave propagating through the beam, and a shunting circuit, connected to the piezoelectric patch, that dissipates electricity generated by the piezoelectric patch to absorb the flexural wave.

In one embodiment, a method of absorbing a flexural wave includes detecting a flexural wave propagating through a beam, generating electricity, in response to the flexural wave, via a piezoelectric patch connected to an arm member that is in mechanical communication with the beam, and dissipating the electricity via a shunting circuit in electrical communication with the piezoelectric patch.

In one embodiment, flexural wave absorption system includes a piezoelectric stack that: 1) is directly connected to a beam that may be subject to flexural waves, 2) is coated with a damping material, and 3) generates electricity in response to a flexural wave propagating through the beam, a mass member connected to the piezoelectric stack, and a shunting circuit, connected to the piezoelectric stack, that dissipates electricity generated by the piezoelectric stack to absorb the flexural wave.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

FIG. 1C illustrates an implementation scenario of another embodiment of a flexural wave absorption system detecting a flexural wave, according to the disclosed subject matter.

DETAILED DESCRIPTION

Systems, methods, and other embodiments associated with absorbing a flexural wave (e.g., traveling through a beam) are disclosed. The disclosed embodiments provide numerous advantages over conventional approaches to absorbing vibrations and flexural waves. Without limitation, the discloses embodiments provide an adaptive flexural wave absorption system that is adaptable and easily tunable to multiple frequency bandwidths.

Figure 1A:
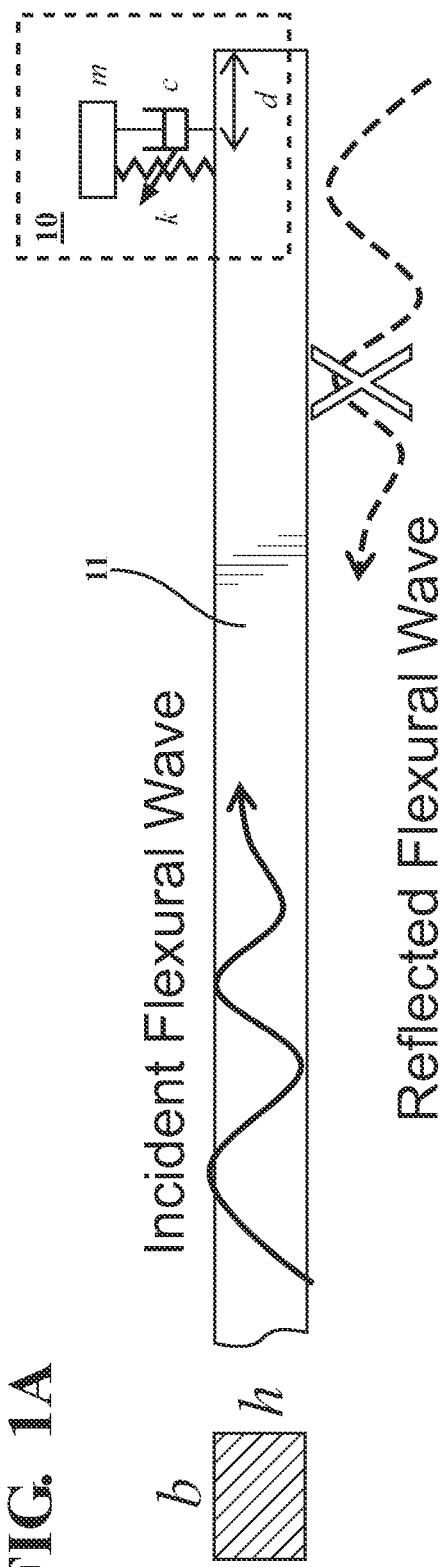
FIG. 1A illustrates an example mass-spring-damper system, according to the disclosed subject matter.

FIG. 1A illustrates an example mass-spring-damper system 10 that models an absorbing effect functionality of the disclosed adaptive flexural wave absorption system. In the example shown in FIG. 1A, a mechanical structure is shown in the form of a beam structure 11 that is subject to an incident flexural wave. In this example, the beam 11 has an open boundary condition (i.e., a free end). However, other implementations should not be limited to this open boundary condition.

The mass-spring-damper system 10 is disposed at a distance d from a free, distal end of the beam 11. This distance d could be zero, but to generally describe system 10, a positive distance d from the boundary will be assumed herein. The mass-spring-damper system 10 includes a discrete mass m distributed throughout an object and interconnected via a network of springs having a spring constant k and dampers having a damping coefficient c. The dimensions of the beam structure 11 are represented by h and b.

As shown in Table I, assuming that the beam structure 11 is, for example, made of aluminum and has dimensions of h as 3 mm and b as 20 mm, the mass-spring-damper system 10 would have the following properties for m, k, and c:

TABLE I

| Beam Structure | | Mass-spring-damper system | |
|---|---|---|---|
| h | 3 mm | m | 0.0013898 kg |
| b | 20 mm | k | 50 kN/m |
| material | aluminum | c | 0.25009 kg/s |

Figure 1B:
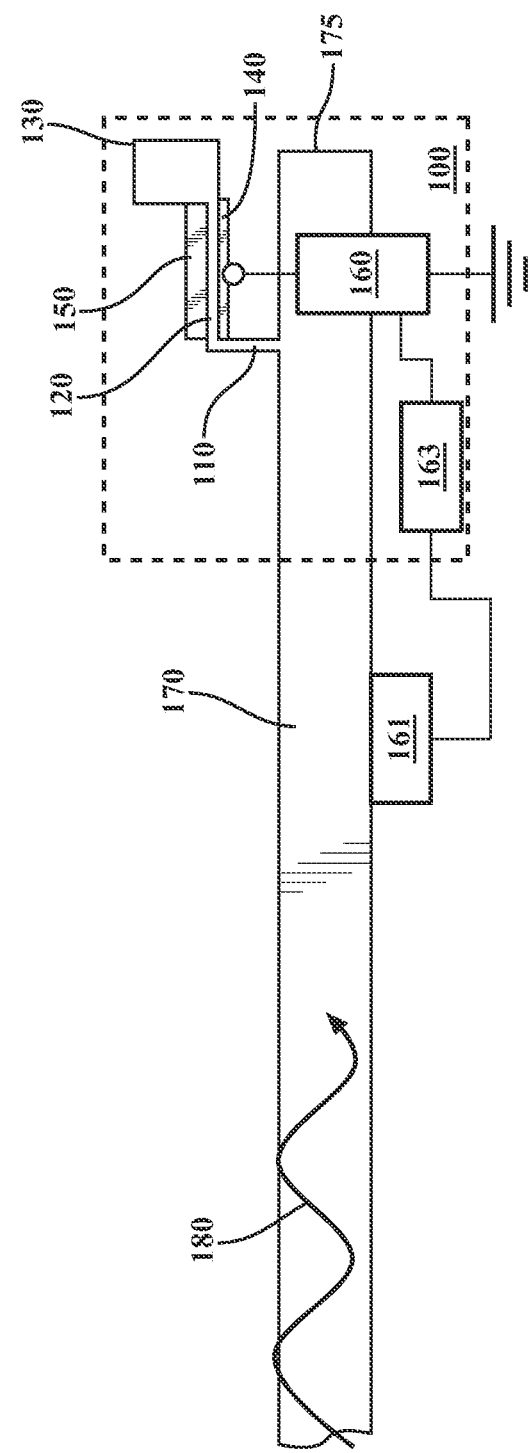
FIG. 1B illustrates an implementation scenario of a flexural wave absorption system connected to a beam with a flexural wave, according to the disclosed subject matter.

Referring to FIG. 1B, an example implementation of the disclosed flexural wave absorption system 100 is illustrated. The system 100 can provide a similar working principle function as the mass-spring-damper system 10 model by considering a first operational mode of the system 100, however, the system 100 is more adaptable to different structural parameters and can achieve higher levels of absorption.

The flexural wave absorption system 100 includes multiple elements. It should be understood that in various embodiments the system 100 may not necessarily include all of the elements shown in FIG. 1B. The system 100 can have any combination of the various elements shown in FIG. 1B. Further, the system 100 can have other elements in addition to those shown in FIG. 1B. In some arrangements, the system 100 may be implemented without one or more of the elements shown in FIG. 1B. While the various elements are shown as being located within the system 100 in FIG. 1B, it should be understood that one or more of these elements can be located external to the system 100.

Some of the possible elements of the disclosed flexural wave absorption system 100 are shown in FIG. 1B and will be described along with subsequent figures. For simplicity and clarity of illustration, where appropriate, reference numerals have been repeated among the different figures to indicate corresponding or analogous elements. In addition, while the discussion outlines numerous specific details to provide a thorough understanding of the embodiments described herein, those of ordinary skill in the art will understand that the embodiments described herein may be practiced using various combinations of these elements.

In any case, in one or more embodiments the disclosed flexural wave absorption system 100 includes a base member 110, an arm member 120 attached to the base member 110, a mass member 130 attached to a distal end of the arm member 120, a piezoelectric patch 140 connected to a first side of the arm member 120, an optional damping material layer 150 that may be disposed on a second side of the arm member 120 opposite the first side, and a shunting circuit 160 connected via electrical communication to the piezoelectric patch 140. The base member 110 is connected to a target mechanical structure, which will be referred to herein as a beam 170. Although the mechanical structure is referred to and illustrated as a beam 170, the mechanical structure may be a pipe or other structure that can be subject to transmitting flexural waves 180. In one or more embodiments, the base member 110 can be connected to the beam 170 near a distal end 175 of the beam 170.

Optionally, in one or more embodiments the flexural wave absorption system 100 can include: 1) a sensor 161 connected to the beam 170 to sense a frequency of a flexural wave propagating through the beam 170 and output frequency data in response, and 2) a controller 163 connected to the sensor 161, to receive the frequency data, and connected to the shunting circuit 160 to control one or more components of the shunting circuit 160 based on the frequency data.

Additionally, as shown in FIG. 1C, in one or more embodiments the flexural wave absorption system 100 can include: 1) a sensor 161 connected to the arm member 120 to sense the response of the arm member 120 when a flexural wave 180 is propagating through the beam 170 and output frequency response data, and 2) a controller 163 connected to the sensor 161, to receive the frequency response data, and connected to the shunting circuit 160 to control one or more components of the shunting circuit 160 based on the frequency response data. The noted functions and methods associated with the disclosed embodiments will become more apparent in the following discussion of the figures.

The piezoelectric patch 140 can be made of a piezoelectric material that possesses the property of converting electrical energy into mechanical energy and vice versa. As such, when mechanical stresses are applied to the piezoelectric patch 140, the piezoelectric patch 140 generates electrical charges. Conversely, when a voltage is applied to the piezoelectric patch 140, the piezoelectric patch 140 generates a mechanical strain.

Figure 1D:
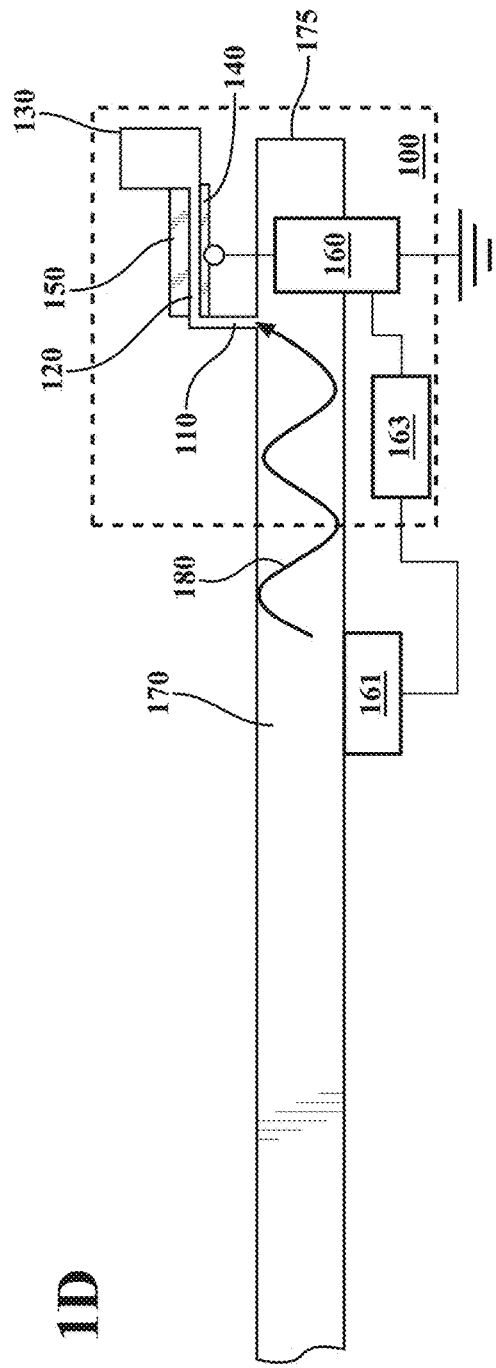
FIG. 1D illustrates an implementation scenario of a flexural wave absorption system detecting a flexural wave, according to the disclosed subject matter.

In actual implementation, a flexural wave 180 propagates through the beam 170 toward the distal end 175. As shown in FIG. 1D, when the flexural wave 180 reaches the disclosed flexural wave absorption system 100, the system 100 can completely or nearly completely absorb the flexural wave 180.

To execute the absorption effect, the piezoelectric patch 140 (e.g., operating in a d31 mode) generates electric charges in response to the flexural wave 180. The shunting circuit 160, in electrical communication with the piezoelectric patch 140, can sense the movement that the flexural wave 180 causes in the beam 170 based on the electric charges generated by the piezoelectric patch 140. In response, the shunting circuit 160 can provide an appropriate voltage (i.e., opposite phase) to the piezoelectric patch 140 to absorb the flexural wave 180. Accordingly, in response to mechanical stress in the beam 170 caused by the flexural wave 180 propagating through the beam 170, the piezoelectric patch 140 generates electrical energy, which is then dissipated by the shunting circuit 160, thereby effectively absorbing the flexural wave 180.

Figure 2A:
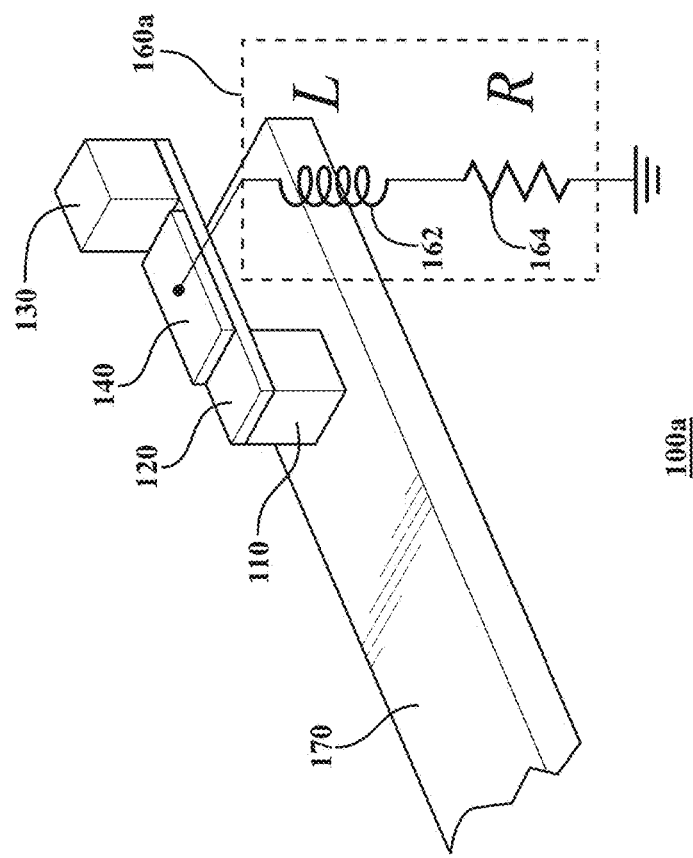
FIG. 2A illustrates one embodiment of a flexural wave absorption system with a first implementation of the shunting circuit, according to the disclosed subject matter.
Figure 2B:
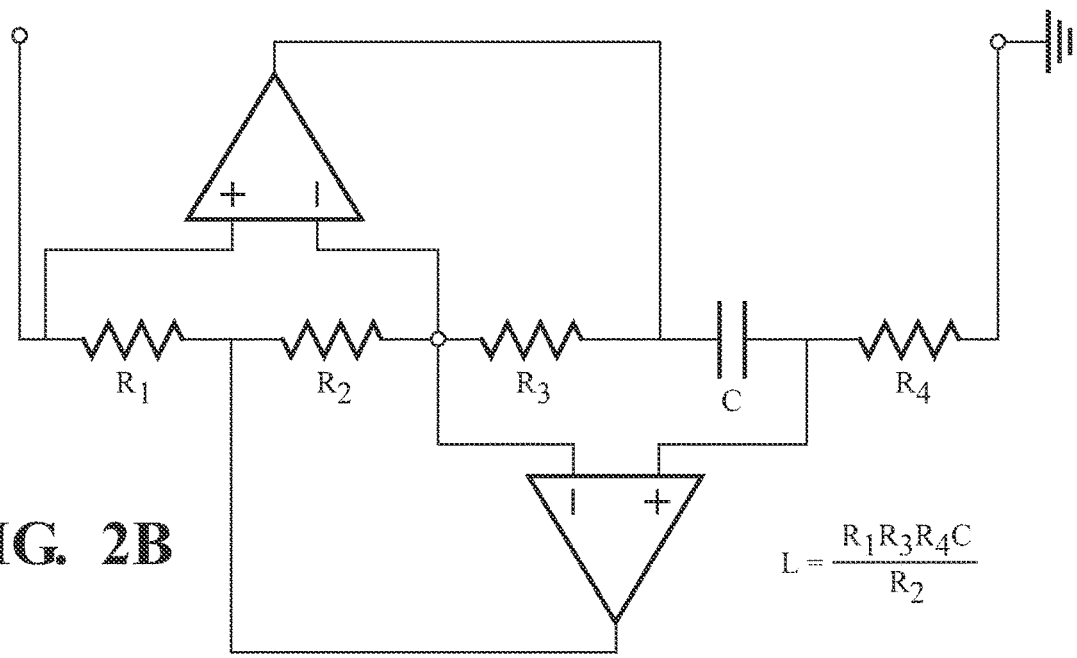
FIG. 2B illustrates an example synthetic inductor, according to the disclosed subject matter.

With reference to FIG. 2A, an embodiment of the flexural wave absorption system 100a is illustrated including, without limitation, a first implementation of the shunting circuit 160a. Note that the term "first implementation" (or similarly "second implementation", "third implementation", etc., as used below) is merely used as a distinguishing term with reference to a particular shunting circuit configuration and does not imply any primacy or particular value order among the disclosed configurations. The shunting circuit 160a is shown including an inductor circuit 162 and a resistor 164. The inductor circuit 162 can be implemented as an analog inductor circuit or a digital, adjustable, inductor circuit. In one or more embodiments, the inductor circuit 162 can be implemented as a synthetic inductor 165 as shown in FIG. 2B. The inductor circuit 162 operates in conjunction with the piezoelectric patch 140 and the resistor 164 to form an equivalent of an RLC circuit that can achieve electrical resonance. Essentially, the inductor circuit 162 and resistor 164 together function to increase a wave absorption coefficient of the shunting circuit 160a.

Table II provides example parameters for the flexural wave absorption system 100a including the shunting circuit 160a:

TABLE II

| Beam Structure | | Flexural wave absorption system | | | |
|---|---|---|---|---|---|
| | | Base | Arm | Mass Member | Piezoelectric Patch |
| Thickness | 3.127 mm | 5 × 5 × 5 (mm) | 21 × 5 × 1 (mm) | 5 × 5 × 5 (mm) | 10 × 5 × 1 (mm) |
| Width | 12.7 mm | | | | |
| | Aluminum | Steel | Aluminum | Steel | PZT-5H |

Figure 3B:
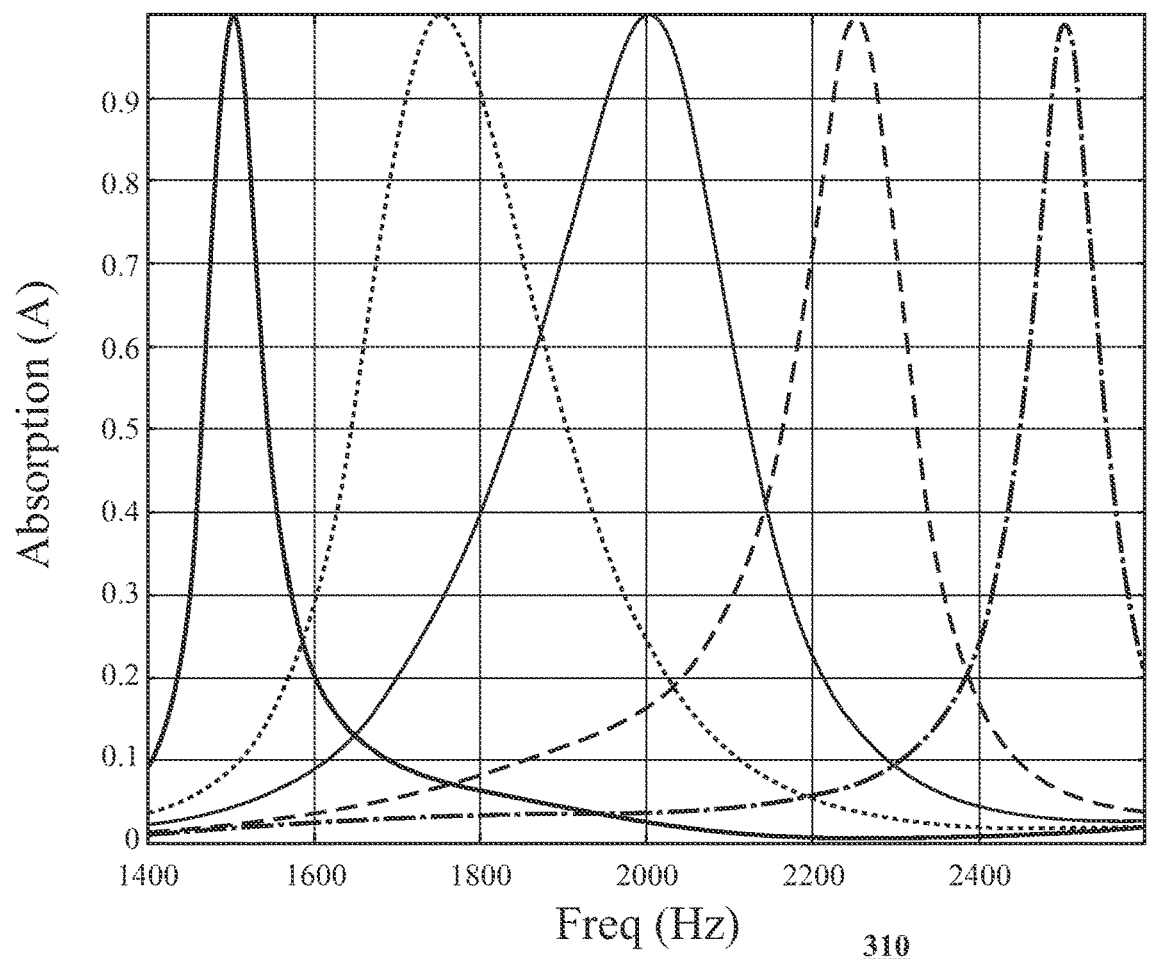
FIG. 3B illustrates an example graph of a flexural wave absorption system optimized to achieve peak absorption at multiple frequencies, according to the disclosed subject matter.
Figure 3A:
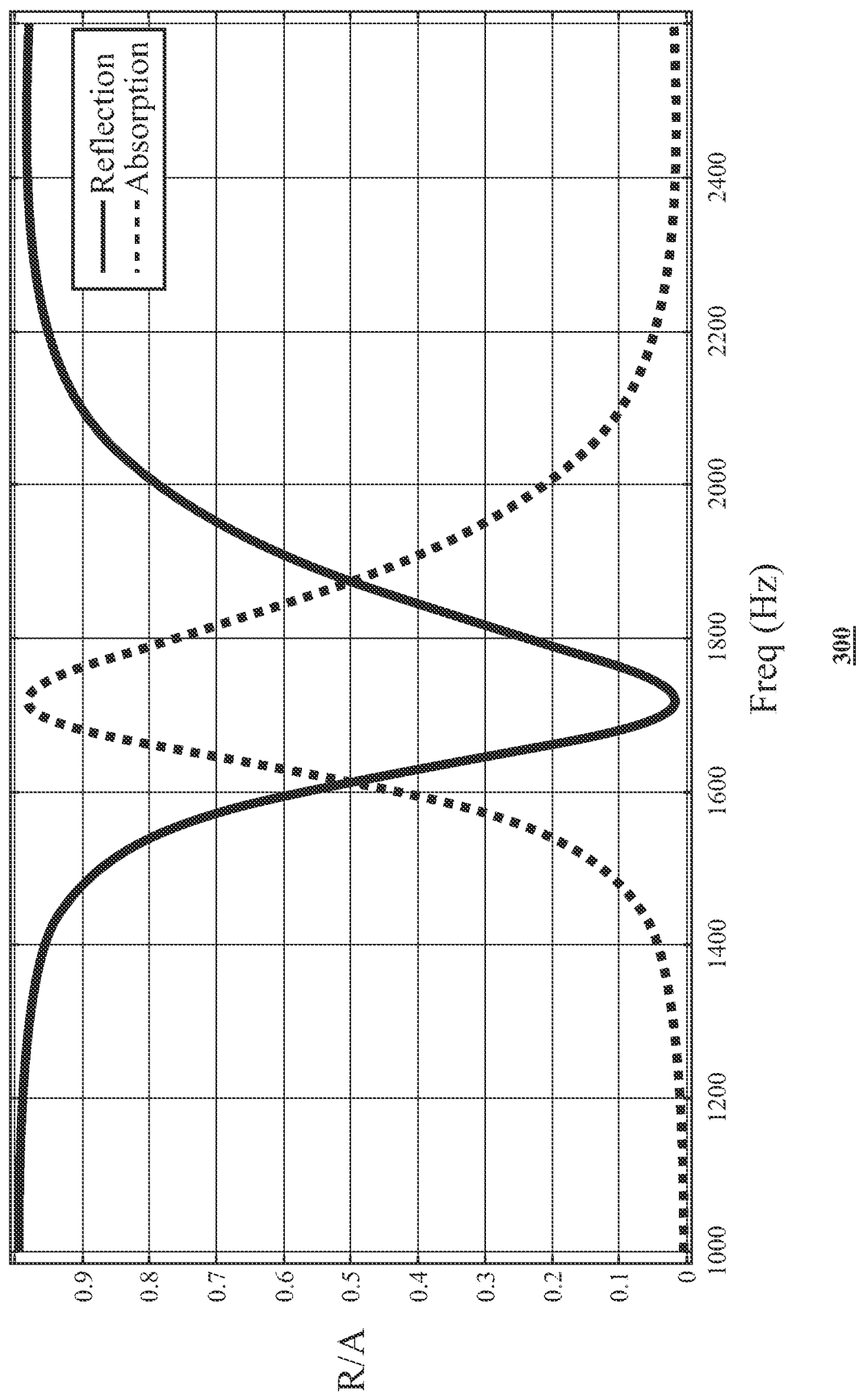
FIG. 3A illustrates an example graph of reflection/absorption (R/A) coefficient versus frequency for the first implementation of the shunting circuit, according to the disclosed subject matter.

FIG. 3A illustrates an example graph 300 that shows the reflection/absorption (R/A) coefficient versus frequency for the shunting circuit 160a with the parameters presented in Table II and inductor 162 at 5.79 H and resistor 164 at 4170Ω. As shown, the flexural wave absorption system 100a with shunting circuit 160a can achieve complete or nearly complete absorption at approximately 1720 Hz. Thus, a flexural wave 180 propagating through the beam 170 at a frequency of 1720 Hz will be completely or nearly completely absorbed by the flexural wave absorption system 100a. However, it is also apparent from FIG. 3A that the absorption efficiency of the system 100a decreases rapidly as the frequency of the flexural wave increases or decreases.

The flexural wave absorption system 100a can be adjusted to absorb flexural waves 180 at different frequencies by changing the inductance and resistance values of the inductor 162 and resistor 164, respectively. Furthermore, the system 100a can adaptively achieve total or nearly total absorption of flexural waves 180 by adjusting the inductance and resistance values, which can be adjusted even more conveniently in real time by implementing digital circuits.

As shown in the graph 310 of FIG. 3B, the flexural wave absorption system 100a can be optimized to achieve peak absorption at multiple frequencies by adjusting the inductance and resistance values of the inductor 162 and resistor 164, respectively.

Figure 4A:
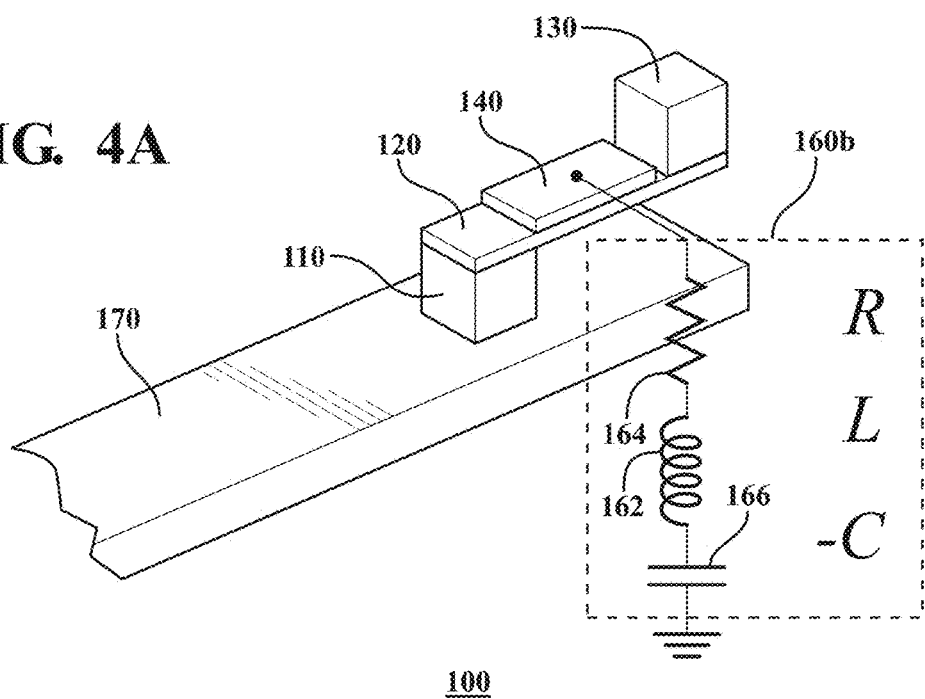
FIG. 4A illustrates an embodiment of a flexural wave absorption system with a second implementation of the shunting circuit, according to the disclosed subject matter.
Figure 4B:
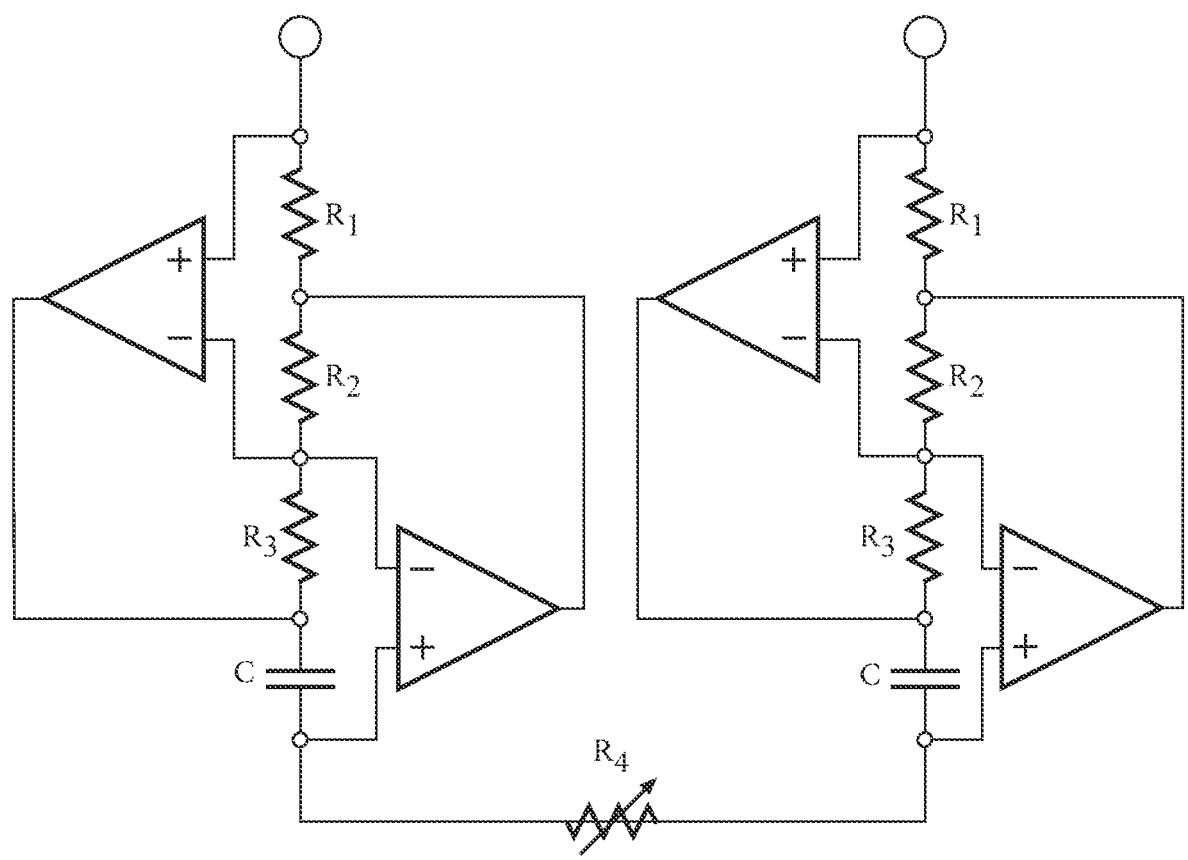
FIG. 4B illustrates an example floating inductor, according to the disclosed subject matter.

FIG. 4A shows an embodiment of the flexural wave absorption system 100 including a second implementation of the shunting circuit 160b. The shunting circuit 160b includes a negative capacitance circuit 166 connected in series with an inductor circuit 162 and resistor 164. In one or more embodiments, the inductor 162 of shunting circuit 160b can be implemented as a floating inductor 167 as shown in FIG. 4B. The inclusion of the negative capacitance circuit 166 further broadens the bandwidth at which the flexural wave absorption system 100 can achieve high levels of absorption.

Figure 5:
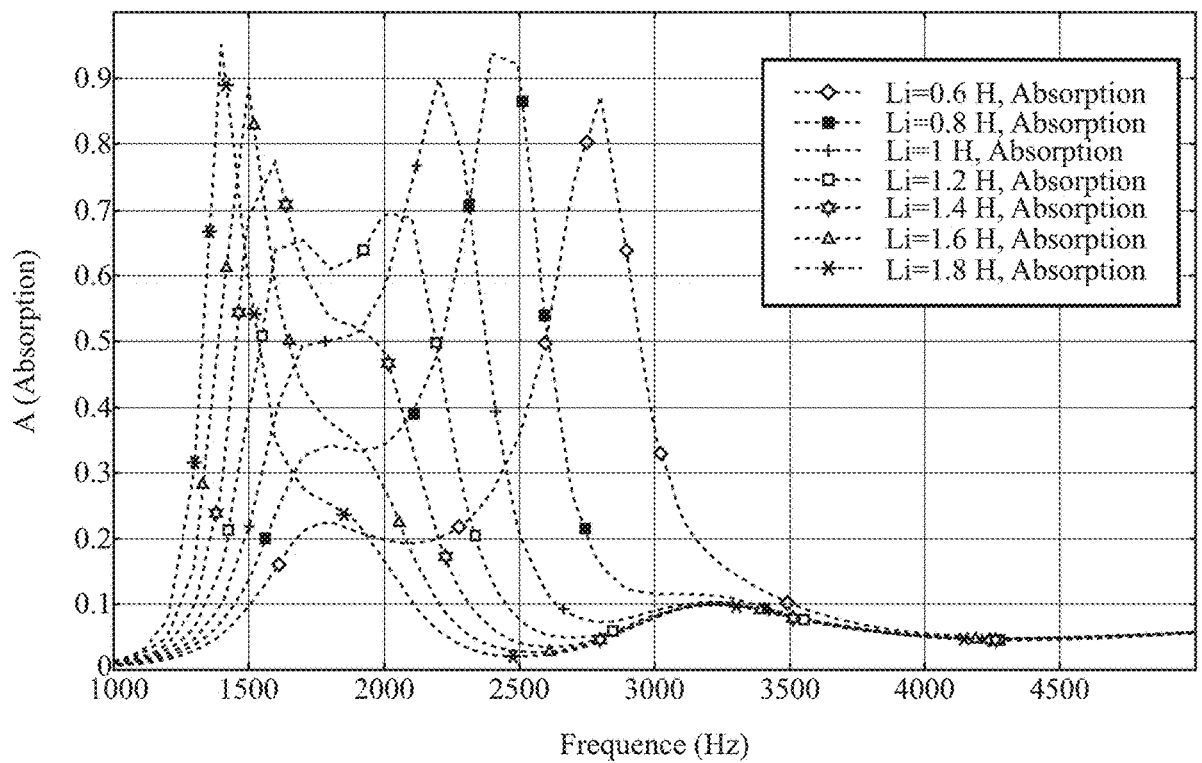
FIG. 5 illustrates an example graph of reflection/absorption (R/A) coefficient versus frequency for the second implementation of the shunting circuit, according to the disclosed subject matter.

FIG. 5 illustrates an example graph 500 that shows the reflection/absorption (R/A) coefficient versus frequency for the shunting circuit 160b with the parameters presented in Table II. The resistor 164 is set at 4000Ω and the negative capacitance −C is set to $\alpha C_p$, where α=−0.8 and Cp is the capacitance of the piezoelectric patch 140. The graph 500 charts the R/A coefficient across varying inductance H values. As shown, the flexural wave absorption system 100 including the shunting circuit 160b can achieve nearly total absorption at two different frequency ranges. Adjusting the inductance value can adjust the frequency ranges that achieve the highest levels of absorption. The graph 500 also shows that the bandwidth of highly effective absorption ranges can increase or decrease with the changes in the inductance H values. The effective bandwidth can further be increased by adjusting the resistance value of the resistor 164. By optimizing the circuit parameters, total absorption can be achieved. However, a greater degree of improvement is possible in other implementations, as will be discussed below.

Figure 6:
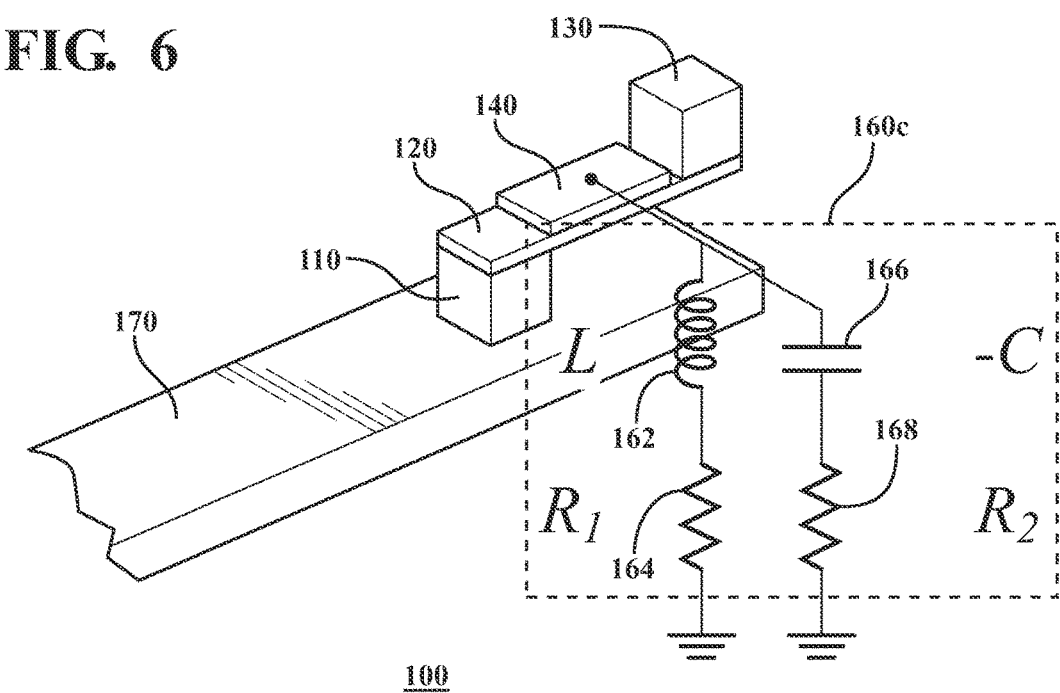
FIG. 6 illustrates one embodiment of a flexural wave absorption system with a third implementation of the shunting circuit, according to the disclosed subject matter.

FIG. 6 shows an embodiment of the flexural wave absorption system 100 including a third implementation of the shunting circuit 160c. The shunting circuit 160c includes a negative capacitance circuit 166 and a second resistor 168 connected in parallel with the inductor circuit 162 and first resistor 164. The inclusion of the negative capacitance circuit 166 further increases the wave absorption coefficient of the shunting circuit 160c and broadens the bandwidth at which the shunting circuit 160c can achieve high levels of absorption.

Figure 7A:
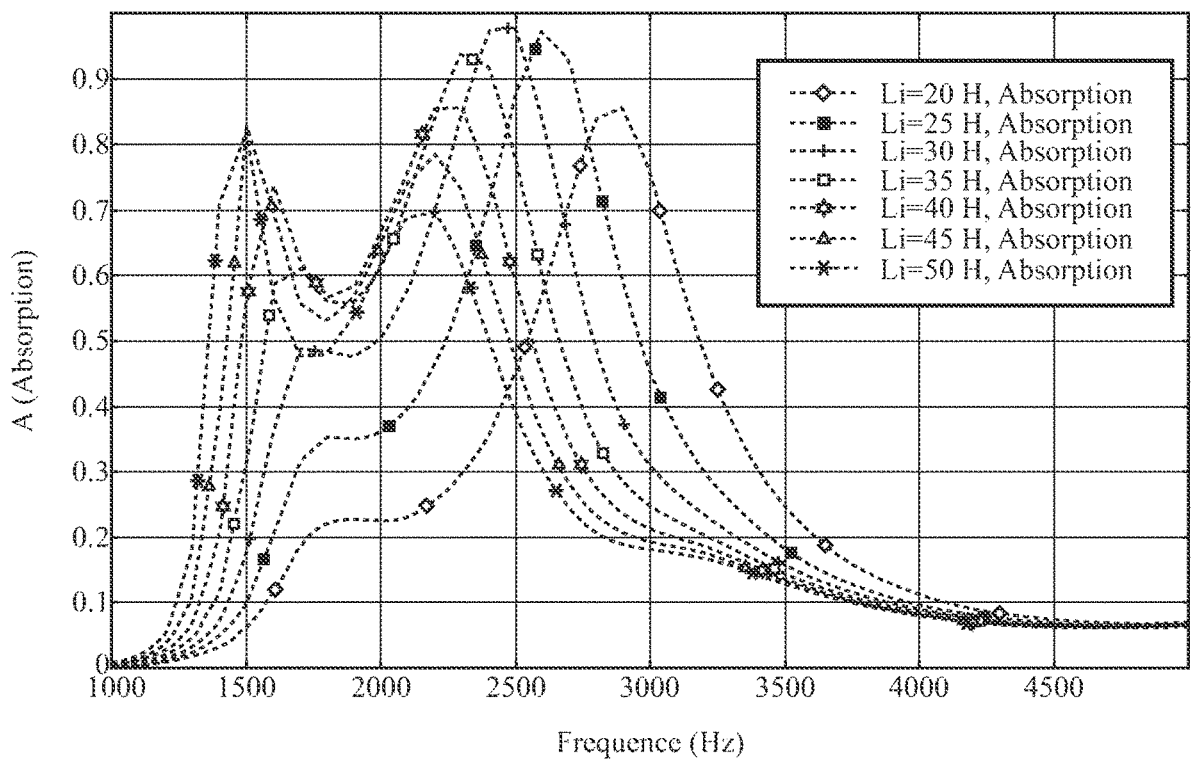
FIG. 7A illustrates an example graph of reflection/absorption (R/A) coefficient versus frequency for the third implementation of the shunting circuit, according to the disclosed subject matter.

FIG. 7A illustrates an example graph 700 that shows the reflection/absorption (R/A) coefficient versus frequency for the shunting circuit 160c with the parameters presented in Table II. In this example both of the resistors 164 and 168 are set at 4000Ω and the negative capacitance −C is set to $\alpha C_p$, where α=−0.8 and Cp is the capacitance of the piezoelectric patch 140. As shown in graph 700, the flexural wave absorption system 100 can exhibit two effective peaks of absorption performance for a given configuration of the shunting circuit 160c. The bandwidth of most effective absorption ranges of the flexural wave absorption system 100 among the two peaks is increased by utilization of the shunting circuit 160c as compared to utilizing the first or second implementations of the shunting circuit 160a, 160b.

Figure 7B:
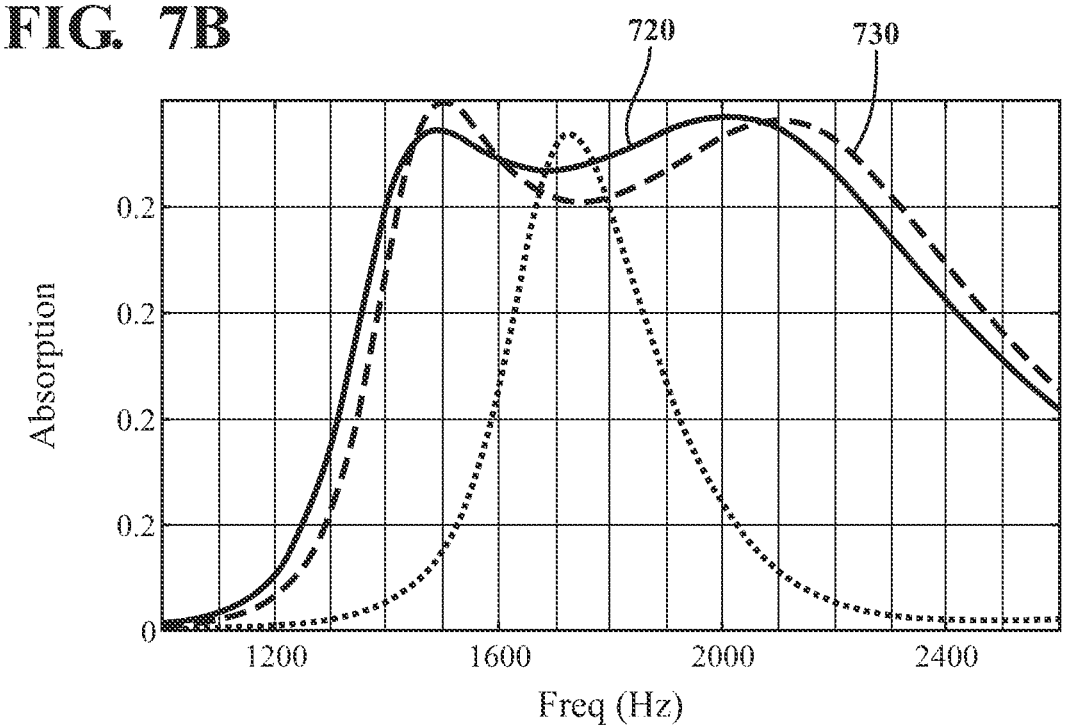
FIG. 7B illustrates another example graph of reflection/absorption (R/A) coefficient versus frequency for the third implementation of the shunting circuit as compared to the first implementation of the shunting circuit, according to the disclosed subject matter.

The gap of low absorption between the two peaks can be further improved (e.g., compared against conventional techniques or against the first or second implementations of the shunting circuit 160a, 160b) by adjusting the resistance values of the resistors 164 and 168. FIG. 7B illustrates an example graph of improved performance configurations for shunting circuit 160c. The line 720 shows the results of the shunting circuit 160c being adjusted to a configuration of the inductor 162 set to 50H, resistor 164 set to 4000Ω, and resistor 168 set to 2000Ω. In this configuration the decrease in absorption efficiency between the two peak performance frequencies is significantly reduced. The line 730 shows the results of the shunting circuit 160c adjusted to a configuration of the inductor 162 set to 47.28H, resistor 164 set to 2656.69Ω, and resistor 168 set to 4468.24Ω. In this configuration the first peak achieves a higher level of absorption.

Figure 8:
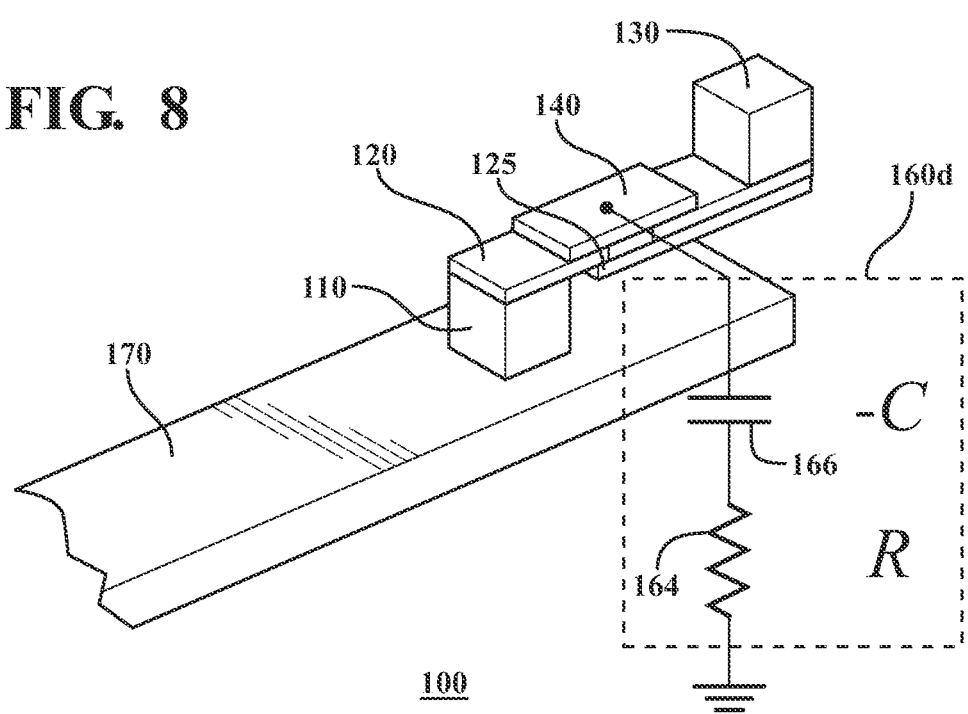
FIG. 8 illustrates an embodiment of a flexural wave absorption system with a fourth implementation of the shunting circuit, according to the disclosed subject matter.

FIG. 8 shows an embodiment of the flexural wave absorption system 100 including a fourth implementation of the shunting circuit 160d. The shunting circuit 160d includes a passive dampening layer 125 disposed on the arm member 120 and a negative capacitance circuit 166 connected in series with a resistor 164. The negative capacitance circuit 166 increases the wave absorption coefficient of the shunting circuit 160d while the dampening layer 125 improves the absorption performance overall of the flexural wave absorption system 100.

Figure 9:
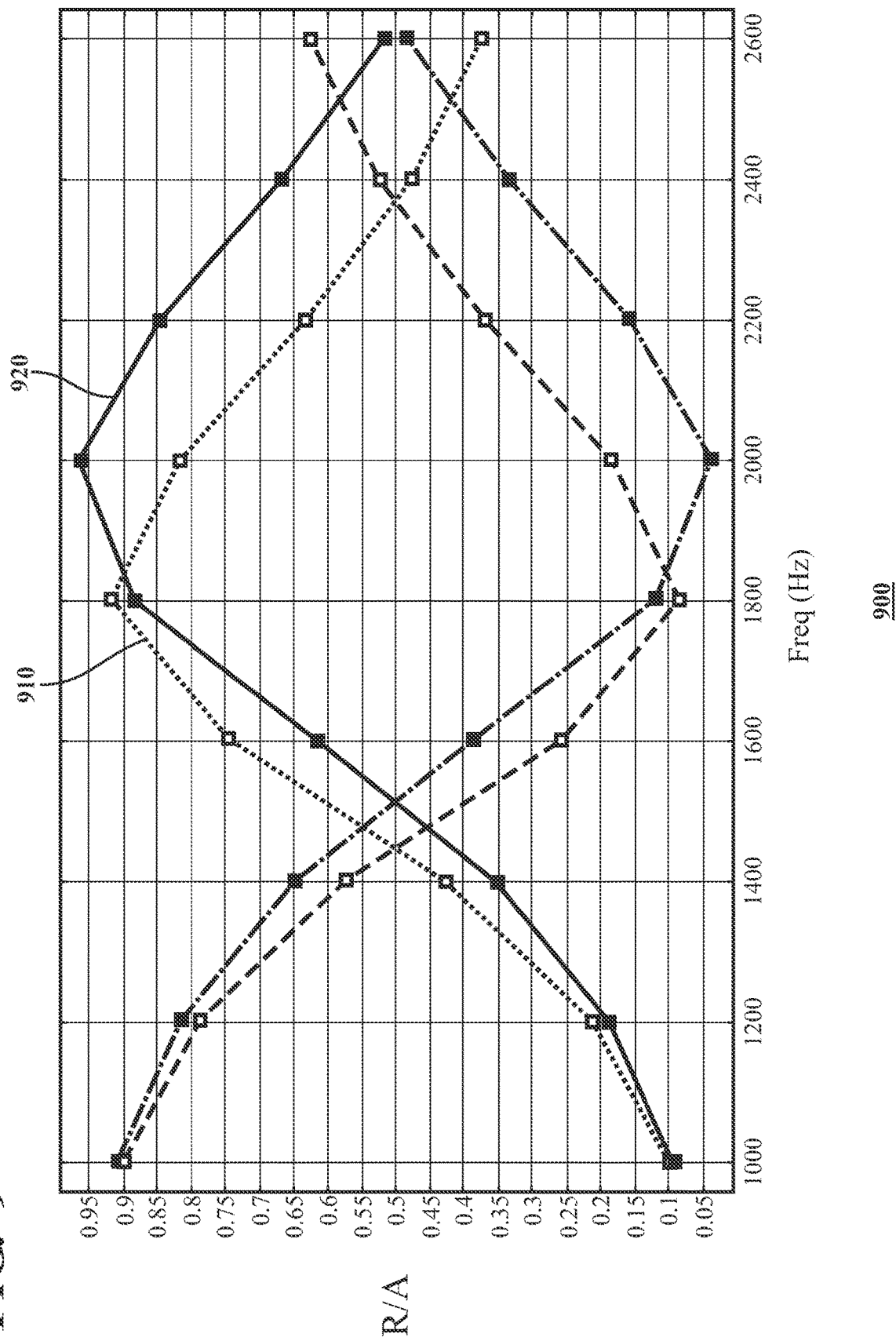
FIG. 9 illustrates an example graph of reflection/absorption (R/A) coefficient versus frequency for the fourth implementation of the shunting circuit, according to the disclosed subject matter.

FIG. 9 illustrates an example graph 900 that shows the reflection/absorption (R/A) coefficient versus frequency for the shunting circuit 160d with the parameters presented in Table II. The line 910 shows the results of the shunting circuit 160d adjusted to a configuration with the capacitance of the negative capacitance circuit set to $\alpha C_p$, where $\alpha=-1.2$ and Cp is the capacitance of the piezoelectric patch 140. The adjustments are to the shift the absorption bandwidth and/or improve performance. For example, the line 920 shows the results of the shunting circuit 160d adjusted to a configuration with the capacitance of the negative capacitance circuit set to $\alpha C_p$, where $\alpha=-0.8$ and Cp is the capacitance of the piezoelectric patch 140. As shown, the line 920 exhibits a shift in peak performance bandwidth and also achieves a higher level of maximum absorption. However, by optimizing the circuit parameters, total absorption can be achieved.

Figure 10:
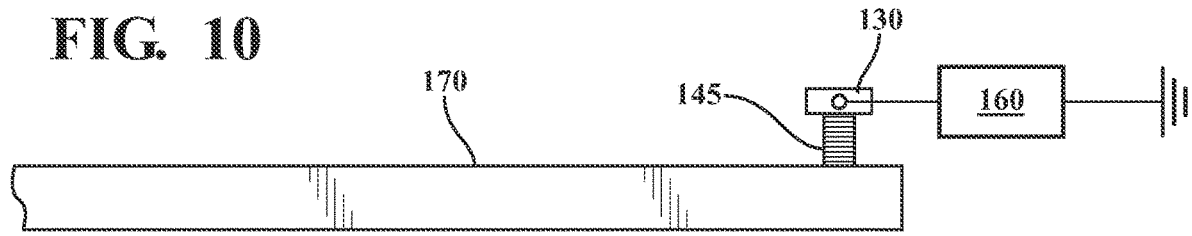
FIG. 10 illustrates another embodiment of a flexural wave absorption system, according to the disclosed subject matter.

The shunting circuit implementations discussed above can also be deployed in difference flexural wave absorption configurations. For example, FIG. 10 shows another embodiment of the flexural wave absorption system. The system includes a piezoelectric stack 145 connected to the beam structure 170, a mass member 130 connected to the piezoelectric stack 145, and a shunting circuit 160 connected to the piezoelectric stack 145. The shunting circuit 160 can be configured, for example, using any of the implementations disclosed herein.

Figure 11:
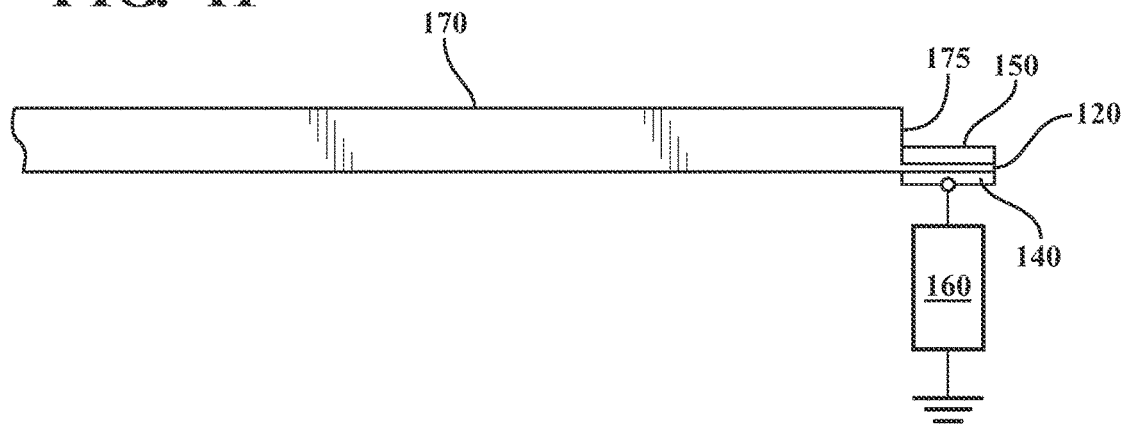
FIG. 11 illustrates yet another embodiment of a flexural wave absorption system, according to the disclosed subject matter.

FIG. 11 shows yet another embodiment of the flexural wave absorption system. The system includes an arm member 120 extending from a distal end 175 of a beam 170. A piezoelectric patch 140 is disposed on a first side of the arm member 120 and a passive dampening material 150 is disposed on a second side of the arm member 120. A shunting circuit 160 is connected to the piezoelectric stack 140. The shunting circuit 160 can be configured, for example, using any of the implementations disclosed herein.

Figure 12:
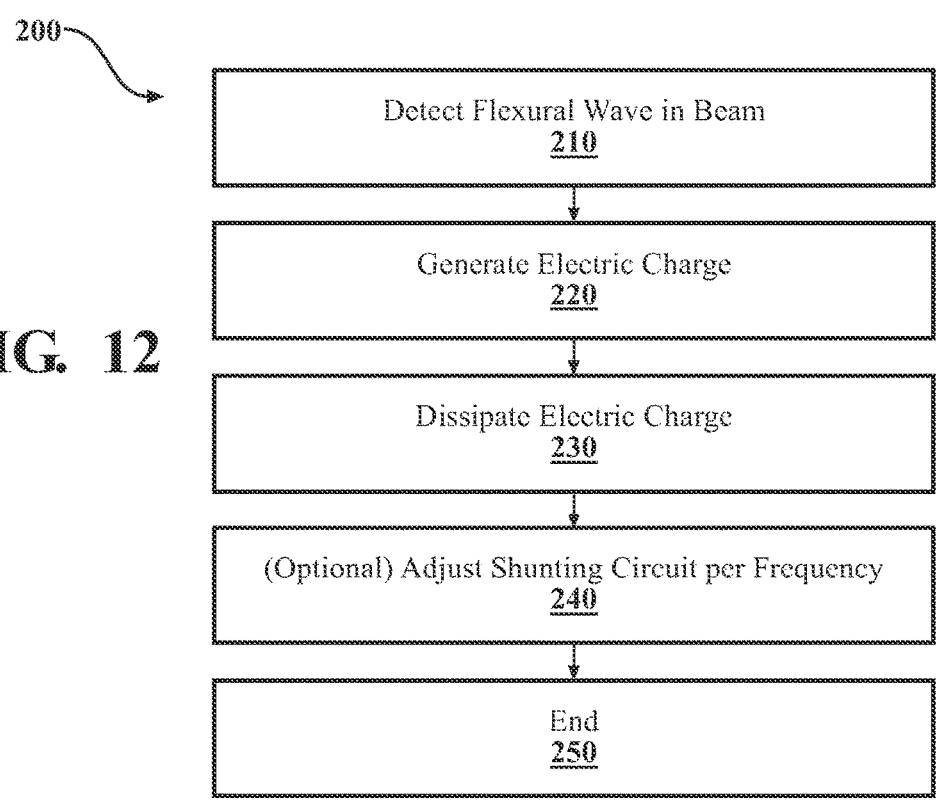
FIG. 12 illustrates a flowchart of a method of absorbing a flexural wave according to the disclosed embodiments.

Additional and optional features of the flexural wave absorption system 100 will now be discussed. FIG. 12 illustrates a flowchart of a method 200 of absorbing a flexural wave according to the disclosed embodiments. Method 200 will be discussed from the perspective of the flexural wave absorption system 100 of FIGS. 1B and 1C. While method 200 is discussed in combination with the flexural wave absorption system 100, it should be appreciated that the method 200 is also not limited to being implemented within the flexural wave absorption system 100 but is instead one example of a system that may implement the method 200.

At operation 210, with the flexural wave absorption system 100 connected to the beam 170, the system 100 detects a flexural wave propagating through the beam 170. For example, in one or more embodiments piezoelectric patch 140 responds to mechanical stress in the beam 170 caused by the flexural wave.

At operation 220, the flexural wave absorption system 100 generates electric charge in response to the flexural wave. For example, in one or more embodiments the piezoelectric patch 140 generates electric charge in response to the mechanical stress in the beam 170. In this manner energy is converted from the form of a propagating flexural wave into electrical energy.

At operation 230, the flexural wave absorption system 100 dissipates the electric charge, thereby effectively absorbing the flexural wave. In one or more embodiments, the shunting circuit 160 generates an opposite charge, in response to the electric charge generated by the piezoelectric patch 140, which dissipates the electric charge generated by the piezoelectric patch 140. Thus, in one or more embodiments the flexural wave absorption system 100 can completely or nearly completely absorb the flexural wave.

At operation 240, one or more components of the flexural wave absorption system 100 can be adjusted based on the frequency of the flexural wave. For example, in one or more embodiments, the flexural wave absorption system 100 can include a sensor 161 connected to the beam 170, and a controller 163 connected to the sensor 161 and the shunting circuit 160. The sensor 161 can generate frequency data in response to the flexural wave, the frequency data indicating a frequency of the flexural wave. The controller 163 can adjust a component of the shunting circuit 160 based on the frequency data.

For example, in one or more embodiments the controller 163 can adjust an inductance level of an inductance circuit or the capacitance level of a negative capacitance circuit in one of the implementations of the shunting circuit 160 as described above to achieve a peak performance of the shunting circuit 160 with respect to the frequency of the flexural wave. That is, consider one example scenario in which the frequency data indicates the flexural wave has a frequency of 2490 Hz and the flexural wave absorption system 100 includes the shunting circuit 160c (FIG. 6) with both of the resistors 164 and 168 set at 4000Ω and the negative capacitance –C is set to $\alpha C_p$, where $\alpha=-0.8$ and Cp is the capacitance of the piezoelectric patch 140. In response to the frequency data, the controller 163 can adjust the inductance level of the inductor circuit 162 to 30H to achieve nearly total absorption of the flexural wave.

When the flexural wave has effectively been absorbed (e.g., by at least a threshold amount), then the process ends at 450.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1B-1D, 2A, 2B, 3A, 3B, 4A, 4B, 5, 6, 7A, 7B, 8-12, but the embodiments are not limited to the illustrated structure or application.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Generally, modules as used herein include routines, programs, objects, components, data structures, and so on that perform particular tasks or implement particular data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an application-specific integrated circuit (ASIC), a hardware component of a system on a chip (SoC), as a programmable logic array (PLA), or as another suitable hardware component that is embedded with a defined configuration set (e.g., instructions) for performing the disclosed functions.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™ Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A flexural wave absorption system, comprising:
a base member connected to a beam that may be subject to flexural waves;
an arm member, connected to the base, disposed substantially in parallel alignment with the beam;
a mass member connected to a distal end of the arm member;

a piezoelectric patch, connected to the arm member, and configured to generate electricity in response to a flexural wave propagating through the beam; and a shunting circuit that includes a reactance device adjustable based on a frequency of the flexure wave, is connected to the piezoelectric patch, and is configured to provide a voltage at an opposite phase of the electricity generated by the piezoelectric patch to absorb the flexural wave.

2. The flexural wave absorption system of claim 1, wherein the shunting circuit includes an inductor circuit configured to increase a wave absorption coefficient of the shunting circuit.

3. The flexural wave absorption system of claim 2, wherein the shunting circuit includes a negative capacitance circuit configured to further increase the wave absorption coefficient of the shunting circuit and is connected in parallel with the inductor circuit.

4. The flexural wave absorption system of claim 2, wherein the shunting circuit includes a negative capacitance circuit configured to further increase the wave absorption coefficient of the shunting circuit and is connected in series with the inductor circuit.

5. The flexural wave absorption system of claim 1, further comprising a damping material layer disposed on the arm member.

6. The flexural wave absorption system of claim 1, further comprising:
a sensor, connected to the beam, configured to detect the flexural wave and, in response, generate frequency data indicating the frequency of the flexural wave; and
a controller, connected to the sensor, configured to receive the frequency data from the sensor and adjust a component of the shunting circuit based on the frequency data.

7. The flexural wave absorption system of claim 1, wherein the arm member is constructed of a same material as the beam, and the base member is constructed of a different material from the beam.

8. A method of absorbing a flexural wave, comprising:
detecting a flexural wave propagating through a beam;
generating electricity, in response to the flexural wave, via a piezoelectric patch connected to an arm member that is in mechanical communication with the beam; and
providing, via a shunting circuit that includes a reactance device adjustable based on a frequency of the flexure wave and is in electrical communication with the piezoelectric patch, a voltage at an opposite phase of the electricity generated by the piezoelectric patch.

9. The method of claim 8, wherein the shunting circuit includes an inductor circuit configured to increase a wave absorption coefficient of the shunting circuit.

10. The method of claim 8, wherein the shunting circuit includes a negative capacitance circuit configured to increase a wave absorption coefficient of the shunting circuit.

11. The method of claim 8, wherein the shunting circuit includes an inductor circuit in series with a negative capacitance circuit configured to increase a wave absorption coefficient of the shunting circuit and a resonant frequency response bandwidth of the shunting circuit.

12. The method of claim 8, wherein the shunting circuit includes an inductor circuit in parallel with a negative capacitance circuit configured to increase a wave absorption coefficient of the shunting circuit and a resonant frequency response bandwidth of the shunting circuit.

13. The method of claim 12, further comprising detecting the frequency of the flexural wave and adjusting the shunting circuit based on the frequency by adjusting an inductance level of the inductor circuit.

14. The method of claim 12, further comprising detecting the frequency of the flexural wave and adjusting the shunting circuit based on the frequency by adjusting a capacitance level of the negative capacitance circuit.

15. A flexural wave absorption system, comprising:
a piezoelectric stack that: 1) is directly connected to a beam that may be subject to flexural waves, 2) is coated with a damping material, and 3) is configured to generate electricity in response to a flexural wave propagating through the beam;
a mass member connected to the piezoelectric stack; and
a shunting circuit that includes a reactance device adjustable based on a frequency of the flexure wave, is connected to the piezoelectric stack, and is configured to provide a voltage at an opposite phase of the electricity generated by the piezoelectric stack to absorb the flexural wave.

16. The flexural wave absorption system of claim 15, wherein the shunting circuit comprises a negative capacitance circuit configured to increase a wave absorption coefficient of the shunting circuit.

17. The flexural wave absorption system of claim 15, wherein the shunting circuit includes an inductor circuit configured to increase a wave absorption coefficient of the shunting circuit.

18. The flexural wave absorption system of claim 16, wherein the shunting circuit includes a negative capacitance circuit configured to further increase the wave absorption coefficient of the shunting circuit and is connected in series with the inductor circuit.

19. The flexural wave absorption system of claim 16, wherein the shunting circuit includes a negative capacitance circuit configured to further increase the wave absorption coefficient of the shunting circuit and is connected in parallel with the inductor circuit.

20. The flexural wave absorption system of claim 19, further comprising:
a sensor, connected to the beam, configured to detect the flexural wave and, in response, generate frequency data indicating the frequency of the flexural wave; and
a controller, connected to the sensor, configured to receive the frequency data from the sensor and adjust a component of the shunting circuit based on the frequency data.

* * * * *